(12) United States Patent
Imaizumi et al.

(10) Patent No.: US 10,418,603 B2
(45) Date of Patent: Sep. 17, 2019

(54) CIRCUIT-SUBSTRATE SUPPORTING DEVICE AND A BATTERY UNIT WITH THE SAME

(75) Inventors: Minoru Imaizumi, Takasaki (JP); Masanori Yamashita, Takasaki (JP)

(73) Assignee: FDK CORPORATION, Minato-ku, Tokyo (JP)

(*) Notice: Subject to any disclaimer, the term of this patent is extended or adjusted under 35 U.S.C. 154(b) by 1232 days.

(21) Appl. No.: 13/227,619

(22) Filed: Sep. 8, 2011

(65) Prior Publication Data

US 2012/0070699 A1    Mar. 22, 2012

(30) Foreign Application Priority Data

Sep. 16, 2010    (JP) .................................. 2010-207966

(51) Int. Cl.
   *H01M 2/10*    (2006.01)
   *H05K 7/14*    (2006.01)
   *H01M 10/42*   (2006.01)

(52) U.S. Cl.
   CPC ......... *H01M 2/105* (2013.01); *H01M 10/425* (2013.01); *H05K 7/142* (2013.01)

(58) Field of Classification Search
   CPC ..... H01M 2/105; H01M 10/425; H05K 7/142
   USPC .......................................................... 429/7
   See application file for complete search history.

(56) References Cited

U.S. PATENT DOCUMENTS

| 4,400,858 A | 8/1983 | Goiffon et al. |
| 5,424,725 A | 6/1995 | Wandt et al. |
| 6,233,156 B1* | 5/2001 | Liao ........................ H05K 7/142 24/563 |
| 2006/0215374 A1 | 9/2006 | Chang |
| 2008/0254356 A1* | 10/2008 | Liersch et al. ................ 429/160 |
| 2010/0165582 A1 | 7/2010 | Hornkamp |
| 2010/0178536 A1* | 7/2010 | Kwak ................. H01M 2/0207 429/7 |
| 2011/0003196 A1* | 1/2011 | Kim .................... H01M 2/0404 429/179 |

FOREIGN PATENT DOCUMENTS

| CN | 1229279 A | 9/1999 |
| CN | 101268569 A | 9/2008 |
| JP | 4-42042 | 4/1992 |
| JP | 4-51187 | 4/1992 |
| JP | 10-012201 A | 1/1998 |
| JP | 2000133224 A | 5/2000 |
| JP | 2006-164601 A | 6/2006 |

OTHER PUBLICATIONS

Office Action issued in EP 11 180 269, dated Apr. 30, 2014.
Extended Search Report for European Patent Application No. 11180260.9-1227, dated Jan. 26, 2012.
Chinese Office Action issued by the Chinese Patent Office in corresponding Chinese Patent Application No. 201110285338.2 and dated Aug. 26, 2014.

* cited by examiner

*Primary Examiner* — Ula C Ruddock
*Assistant Examiner* — Frank A Chernow
(74) *Attorney, Agent, or Firm* — Marshall, Gerstein & Borun LLP (57) ABSTRACT

A circuit substrate, a plurality of supporting members that are arranged at intervals in a longitudinal direction of the circuit substrate and support both longitudinal ends of the circuit substrate, and a housing onto which the supporting members are fixed are included.

7 Claims, 5 Drawing Sheets

CIRCUIT-SUBSTRATE SUPPORTING DEVICE AND A BATTERY UNIT WITH THE SAME

CROSS-REFERENCE TO RELATED APPLICATION

The present application claims the benefit of priority of Japanese Patent Application No. 2010-207966, filed Sep. 16, 2010. The entire disclosure of the priority application is incorporated herein by reference in its entirety.

BACKGROUND OF THE INVENTION

Field of the Invention

The present invention relates to a circuit-substrate supporting device that supports a circuit substrate by using a supporting member or the like, and a battery unit with the circuit-substrate supporting device.

Description of the Related Art

Well-known battery units include battery packs and the like in which batteries, such as lithium-ion secondary batteries and nickel-hydrogen secondary batteries, and a circuit substrate mounted with a battery protection circuit and the like are built into a housing as a unit. In a battery unit like this, a circuit substrate is generally installed adjacent to batteries while being supported by a supporting member, such as a battery holder and a substrate holder (see Unexamined Japanese Patent Publication No. 10-12201 or 2006-164601).

In the conventional battery unit, the circuit substrate is supported by a single supporting member that is larger than the outer shape of the circuit substrate (that is of a size encompassing the outer shape of the circuit substrate) in order to firmly support the circuit substrate.

In the conventional battery unit, the supporting member of the circuit substrate is generally made by molding an insulating material such as plastic to prevent a short circuit of an electronic circuit constructed in the circuit substrate, and the like. On the other hand, there is the possibility that a supporting member like this might be bent and deformed by a remaining stress from the molding. For that reason, in the conventional battery unit where the circuit substrate is supported by a single supporting member that is larger than the outer shape of the circuit substrate, a bending stress sometimes acts upon the circuit substrate due to the bent and deformed supporting member, which might cause a deformation such as warping, fracture or the like in the circuit substrate.

SUMMARY OF THE INVENTION

An aspect of the present invention is directed to a circuit-substrate supporting device having a circuit substrate, a plurality of supporting members that are arranged at intervals in a longitudinal direction of the circuit substrate and support both longitudinal ends of the circuit substrate, and a housing onto which the supporting members are fixed.

Under these characteristics, the supporting members are arranged at intervals in the longitudinal direction of the circuit substrate, and the circuit substrate is supported at the longitudinal ends by the supporting members. This enables a more drastic reduction in bending stress that is applied from the supporting members to the circuit substrate, as compared to conventional art using a single supporting member larger than an outer shape of the circuit substrate. The invention therefore reduces the possibility of deformation and fracture of the circuit substrate and the like in the circuit-substrate supporting device.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION OF THE INVENTION

An embodiment of the invention will be described below with reference to FIGS. 1 to 5.

First, a configuration of a battery unit 10 of the invention will be described. The battery unit 10 of the present embodiment is an emergency power source of a so-called server (computer that provides functions, data, etc. to a client device in network).

The battery unit 10 includes a circuit substrate 4, four substrate holders 5 (supporting members) that are arranged at intervals in a longitudinal direction X of the circuit substrate 4 and support both longitudinal ends of the circuit substrate 4, a housing cover 1 and a housing body 2 (housing) onto which the substrate holders 5 are fixed, and a plurality of batteries 3 supported in the housing body 2 and arranged adjacent to the circuit substrate 4. The battery unit 10 includes a DC-DC converter mount section 20. Built in the DC-DC converter mount section 20 is a DC-DC converter, not shown, that steps down the output voltage of the batteries 3 to rated voltage.

The housing cover 1 is a long metal member having a substantially U-shaped cross section. In one longitudinal end of the housing cover 1, there is a stepped portion 17 that is formed by doing bending work so as to provide a step in the longitudinal end. Four circular through-holes 11 are formed in the stepped portion 17. In one lateral end of the housing cover 1, there is a stepped portion 19 that is formed by doing bending work so as to provide a step in the lateral end. A female screw hole 12 is formed in the stepped portion 19. Furthermore, two circular through-holes 13 and four circular through-holes 14 are formed in the housing cover 1 at predetermined positions.

The housing body 2 is a substantially box-shaped member that opens in a section onto which the housing cover 1 is mounted. In one longitudinal end 27 of the housing body 2, there are formed four circular through-holes 21 corresponding to the four circular through-holes 11 formed in the housing cover 1. In the housing body 2, two female screw holes 23 are formed at positions corresponding to the two circular through-holes 13 of the housing cover 1, and four female screw holes 24 at positions corresponding to the four circular through-holes 14 of the housing cover 1.

The batteries 3 are so-called nickel-hydrogen secondary batteries and situated inside the housing body 2. The batteries 3 each have a diameter of 18 mm and a length of 67 mm. The output voltage of each of the batteries 3 is approximately 1.2 V. The battery unit 10 contains 54 batteries 3 arranged into three blocks of 18 serially-connected batteries including 3 strings of 6 batteries each. These three battery blocks are connected to each other in parallel. The total output voltage of the 54 batteries 3 is approximately 21.6 V that is obtained by multiplying 1.2 V by eighteen batteries. This total output voltage is stepped down by the DC-DC converter mount section 20 to a rated voltage of 12 V and is then outputted from the battery unit 10.

Needless to say, according to the invention, the batteries 3 are not limited to the foregoing in terms of kinds, size, number and the like. The DC-DC converter mount section 20 may be properly provided as needed, and is not an essential constituent of the invention.

The circuit substrate 4 is mounted with a charge-discharge protection circuit of the batteries 3 and the like, and is situated adjacent to an upper face of the battery group formed of the batteries 3. In the circuit substrate 4, eight notches 41a to 41h are formed in the longitudinal ends at intervals in the longitudinal direction X. The notches 41a to 41h have an identical substantially rectangular shape, and are formed four each at intervals in the longitudinal ends of the circuit substrate 4. More specifically, the notches 41a to 41d of the circuit substrate 4 are formed in one of the longitudinal ends at positions spaced away from each other at regular intervals in the longitudinal direction X, and the notches 41e to 41h in the other longitudinal end at positions spaced away from each other at regular intervals in the longitudinal direction X. The notches 41a and 41e are formed at the same positions as viewed in the longitudinal direction X (positions opposite to each other in the lateral direction Y) so as to have symmetrical shapes. Likewise, the notches 41b, 41c and 41d are formed at the same positions as the notches 41f, 41g and 41h, respectively, as viewed in the longitudinal direction X (positions opposite to each other in the lateral direction Y) so as to have symmetrical shapes. In short, in the circuit substrate 4, pairs of symmetrical notches opposite to each other in the lateral direction Y are formed at positions spaced away from each other at regular intervals in the longitudinal direction X.

The number, shape, layout and the like of the notches 41a to 41h are not limited to the above-mentioned aspect. Any aspect is possible as long as a plurality of notches are formed in the longitudinal ends of the circuit substrate 4 at intervals in the longitudinal direction X.

The four substrate holders 5 serving as "supporting members" are members for supporting the circuit substrate 4. The substrate holders 5 are arranged in positions corresponding to the respective notches 41a to 41h of the circuit substrate 4 and support the longitudinal ends of the circuit substrate 4 while being in engagement with the notches 41a to 41h. More specifically, the four substrate holders 5 are arranged in such positions that both end portions (first and second substrate-supporting portions 52 and 53 mentioned below) thereof are engaged with the respective pairs of the notches, that is, the pair of notches 41a and 41e, that of 41b and 41f, that of 41c and 41g, and that of 41d and 41h. The four substrate holders 5 are then screwed to the housing body 2. The circuit substrate 4 is mounted on the housing body 2 by using the four substrate holders 5.

Figure 4:
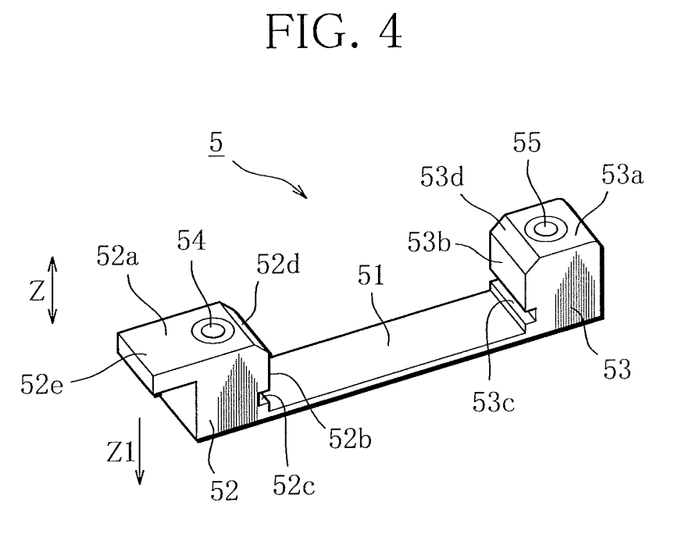
FIG. 4 is a perspective view of a substrate holder.

The configuration of the substrate holders 5 will be explained below in details with reference to FIGS. 4 and 5.

The substrate holder 5 is made up of a thin plate-shaped connecting plate 51 (base portion) that is elastically deformable, a first substrate-supporting portion 52 that is arranged at one end of the connecting plate 51 in a standing manner, and a second substrate-supporting portion 53 that is arranged at the other end of the connecting plate 51 in a standing manner. The substrate holders 5 is a member in which the connecting plate 51, the first substrate-supporting portion 52 and the second substrate-supporting portion 53 are integrally molded into a substantially U-like shape. Each of the first and second substrate-supporting portions 52 and 53 has a substantially rectangular parallelepiped shape that is engageable with the notches 41a to 41h of the circuit substrate 4.

A metal screw bushing 54 provided with a female screw hole is embedded in the first substrate-supporting portion 52 of the substrate holder 5 from an upper surface 52a side, and is fixed to be unturnable. In the same manner, a metal screw bushing 55 provided with a female screw hole is embedded in the second substrate-supporting portion 53 from an upper surface 53a side, and is fixed to be unturnable.

Furthermore, in the substrate holder 5, grooves 52c and 53c are formed in an inner surface 52b of the first substrate-supporting portion 52 and an inner surface 53b of the second substrate-supporting portion 53, which face each other, so as to be engageable with the longitudinal ends at the corresponding pair of notches (the pair of notches 41a and 41e, that of 41b and 41f, that of 41c and 41g or that of 41d and 41h) of the circuit substrate 4. Supporting positions at which the circuit substrate 4 in the battery unit 10 is supported in a vertical direction Z (direction orthogonal to the longitudinal direction X and the lateral direction Y) are defined by the grooves 52c and 53c. To be more specific, each of the supporting positions at which the circuit substrate 4 in the battery unit 10 is supported in the vertical direction Z is defined by distance between the upper surface 52a of the first substrate-supporting portion 52 in which the metal screw bushing 54 is embedded and the groove 52c, and distance between the upper surface 53a of the second substrate-supporting portion 53 in which the metal screw bushing 55 is embedded and the groove 53c.

In the substrate holder 5, there are further formed a slant face 52d slanting from the upper surface 52a of the first substrate-supporting portion 52 into the inner surface 52b and a slant face 53d slanting from the upper face 53a of the second substrate-supporting portion 53 into the inner surface 53b. A lever portion 52e is formed in the first substrate-supporting portion 52 so as to protrude in an outward direction. A protrusion 53e (see FIG. 5) is formed in an outer surface of the second substrate-supporting portion 53.

An assembly structure of the battery unit 10 of the invention will be described below.

Figure 3:
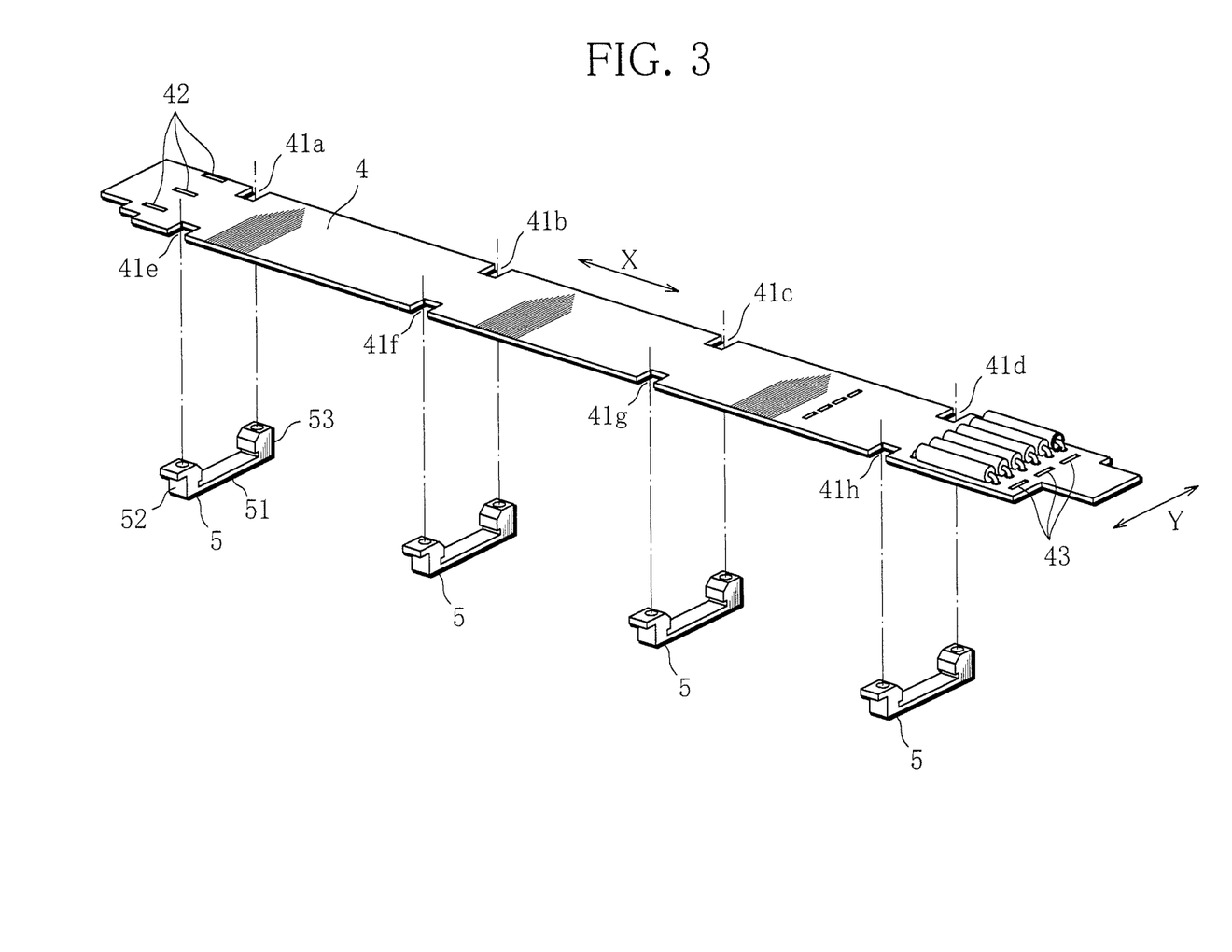
FIG. 3 is an exploded perspective view of a main part of the battery unit, showing a part of the battery unit according to the invention.

First, the four substrate holders 5 are fitted to the circuit substrate 4 at the positions where the notches 41a to 41h are formed (FIG. 3). Distance between the first and second substrate-supporting portions 52 and 53 of the substrate holder 5 can be widened by elastically deforming the connecting plate 51. The substrate holder 5 can be fitted to the circuit substrate 4 by setting the circuit substrate 4 in between the first and second substrate-supporting portions 52 and 53 of the substrate holder 5 while elastically deforming the connecting plate 51 of the substrate holder 5. At this moment, the circuit substrate 4 is guided by the slat face 52d formed in the first substrate-supporting portion 52 and the slat face 53d in the second substrate-supporting portion 53, and enters between the first and second substrate-supporting portions 52 and 53 of the substrate holder 5. It is therefore possible to smoothly set the circuit substrate 4 in between the first and second substrate-supporting portions 52 and 53 with a smaller force.

Alternatively, the distance between the first and second substrate-supporting portions 52 and 53 of the substrate holder 5 can be widened, for example, by pushing the lever portion 52e formed in the first substrate-supporting portion 52 in a downward direction (direction shown by "Z1"). In this way, the distance between the first and second substrate-supporting portions 52 and 53 of the substrate holder 5 can be easily widened by elastically deforming the connecting plate 51 with a slight force.

Figure 5:
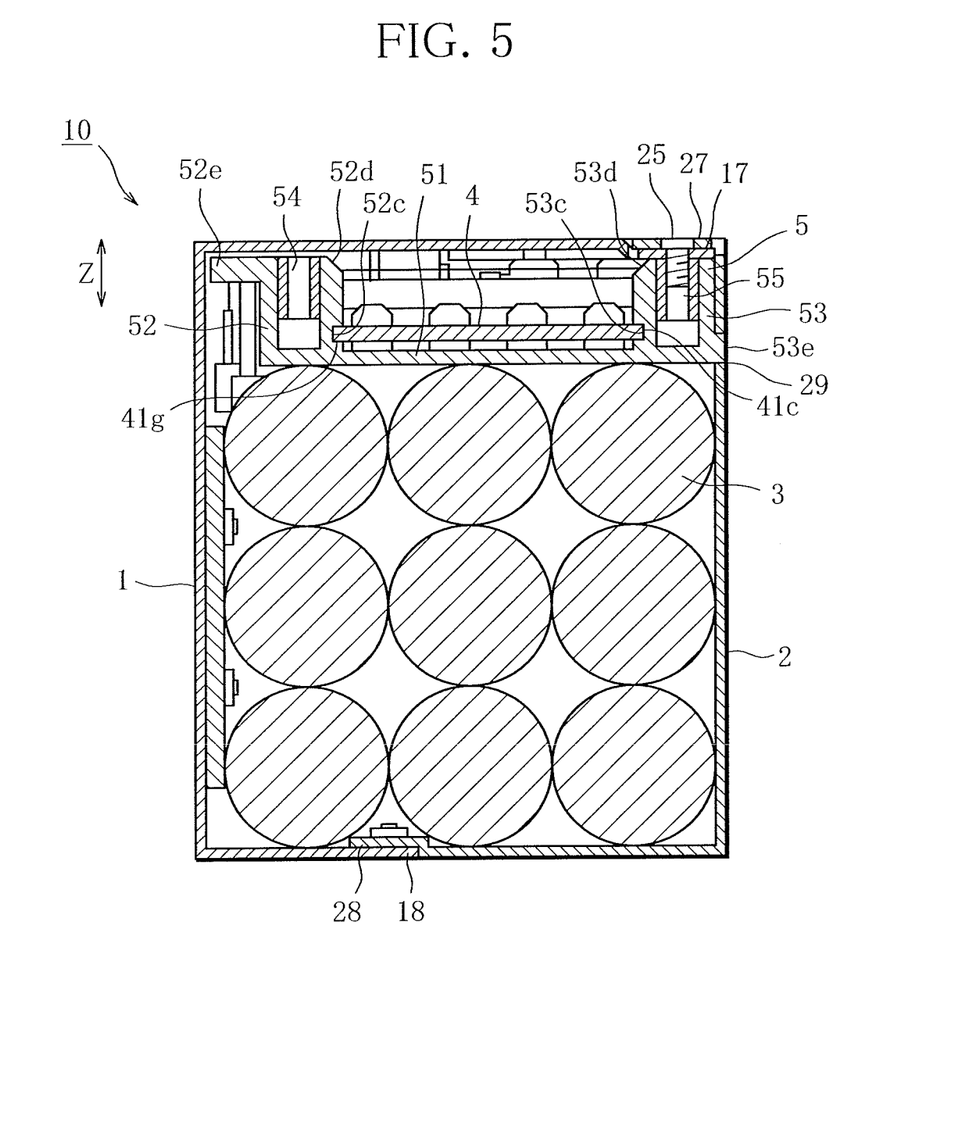
FIG. 5 is a cross-sectional view of the battery unit according to the invention, taken along line A-A.

The circuit substrate 4 to which the four substrate holders 5 are fitted is supported by the substrate holders 5 with the first and second substrate-supporting portions 52 and 53 of the substrate holders 5 engaged with the notches 41a to 41h, and with the longitudinal ends interfitted in the grooves 52c and 53c of the substrate holders 5 at the notches 41a to 41h (FIG. 5).

When the substrate holder 5 fitted to the circuit substrate 4 is to be detached, it is only necessary to widen the distance between the first and second substrate-supporting portions 52 and 53 by elastically deforming the connecting plate 51. For example, if the lever portion 52e formed in the first substrate-supporting portion 52 is pushed in the downward direction (direction shown by "Z1"), it is possible to elastically deform the connecting plate 51 and widen the distance between the first and second substrate-supporting portions 52 and 53 with a slight force and ease as in the case when the substrate holder 5 is fitted to the circuit substrate 4.

In the next place, the 54 batteries 3 are loaded into the housing body 2. More specifically, three battery blocks welded to a lead plate, not shown, made of a metal sheet are formed, each battery block containing 18 serially-connected batteries 3 including three batteries arranged in a width direction and six in a length direction adjacently to each other. These three battery blocks are loaded into the housing body 2 in layers. The three battery blocks may be integrally put together with adhesive tape or the like if desired.

Figure 2:
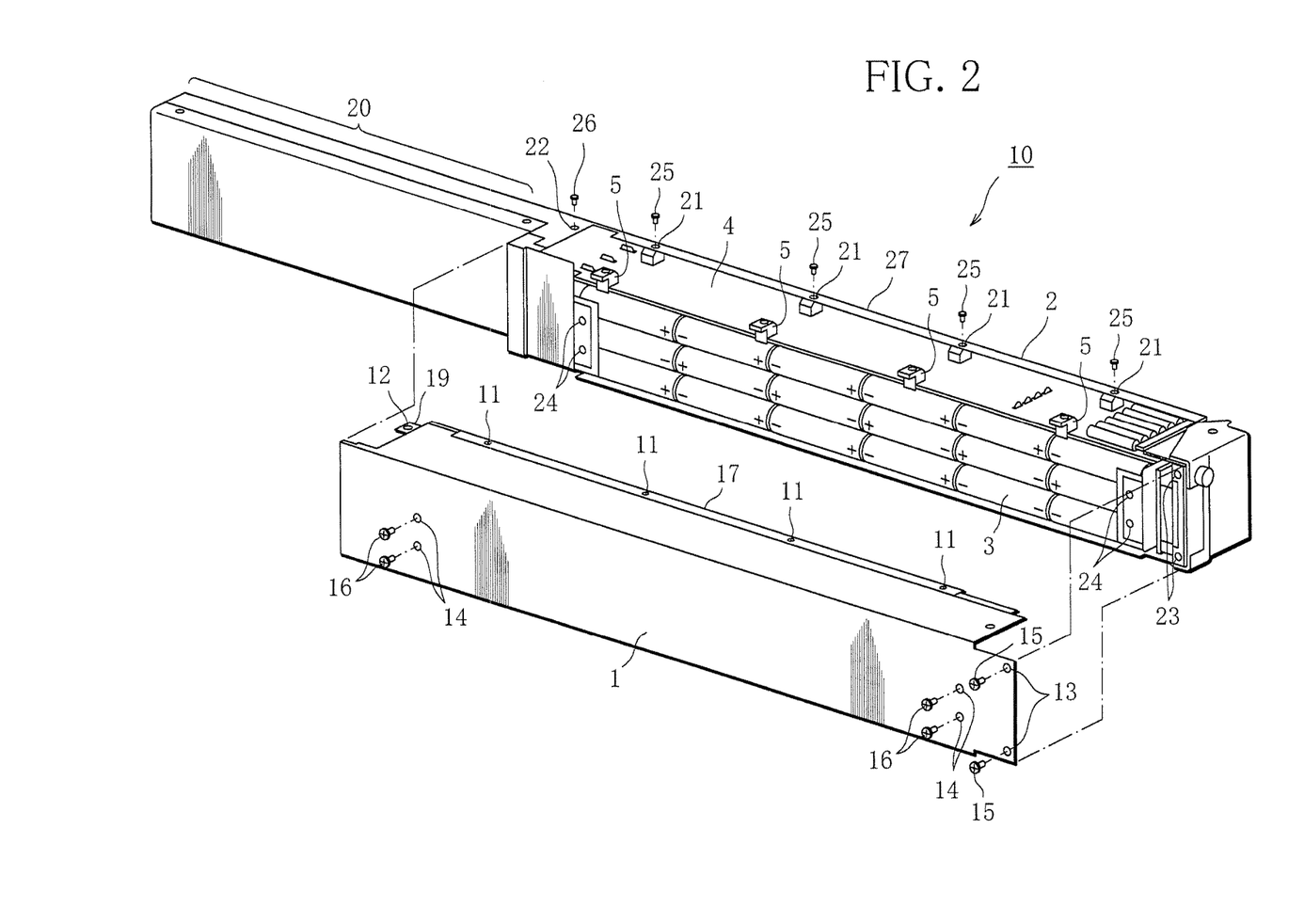
FIG. 2 is an exploded perspective view showing the battery unit according to the invention.

The circuit substrate 4 to which the four substrate holders 5 are fitted is placed at a position adjacent to an upper face side of the battery block located on top of the three battery blocks in layers with the connecting plates 51 of the substrate holders 5 intervening between the upper face of the battery block on top and the circuit substrate 4 (FIG. 2). The protrusions 53e of the four substrate holders 5 are interfitted in four positioning holes 29 formed at predetermined positions of the housing body 2. The positioning holes 29 are formed at the positions corresponding to the protrusions 53e of the four substrate holders 5 fitted to the circuit substrate 4. The circuit substrate 4 is positioned relative to the housing body 2 as viewed in the longitudinal direction X, the lateral direction Y and the vertical direction Z by interfitting the protrusions 53e of the four substrate holders 5 in the positioning holes 29 of the housing body 2.

As mentioned, the positions at which the circuit substrate 4 is supported in the vertical direction Z in the battery unit 10 are defined by the grooves 52c and 53c of the substrate holders 5. Distance between the batteries 3 and the circuit substrate 4 in the vertical direction Z is then defined to be predetermined distance by the grooves 52c and 53c of the substrate holders 5. This reduces the possibility that the circuit substrate 4 will contact the batteries 3 to cause a short circuit and the like. Distance from the housing cover 1 and the housing body 2 to the circuit substrate 4 in the vertical direction Z is also defined to be predetermined distance by the grooves 52c and 53c of the substrate holders 5. This reduces the possibility that the circuit substrate 4 will contact the housing cover 1 or the housing body 2 to cause a short circuit and the like.

Preferably, the positions of the grooves 52c and 53c of the substrate holder 5 are determined in consideration of the mounting height of electronic components mounted on the circuit substrate 4. This reduces the possibility that the electronic components mounted on the circuit substrate 4 will interfere with the housing cover 1, the housing body 2 or the batteries 3. Further preferably, an insulating sheet or the like, not shown, is provided, for example, between the substrate holders 5 and the batteries 3, and also between the upper surface of the circuit substrate 4 and the housing cover 1, as needed.

Protrusions, not shown, formed in both lateral ends of the lead plate, not shown, of each of the battery blocks are inserted into three longitudinally elongated holes 42 formed in one lateral end of the circuit substrate 4 and three laterally elongated holes 43 formed in the other lateral end. The protrusions of the lead plate are then soldered and fixed onto the circuit substrate 4.

Figure 1:
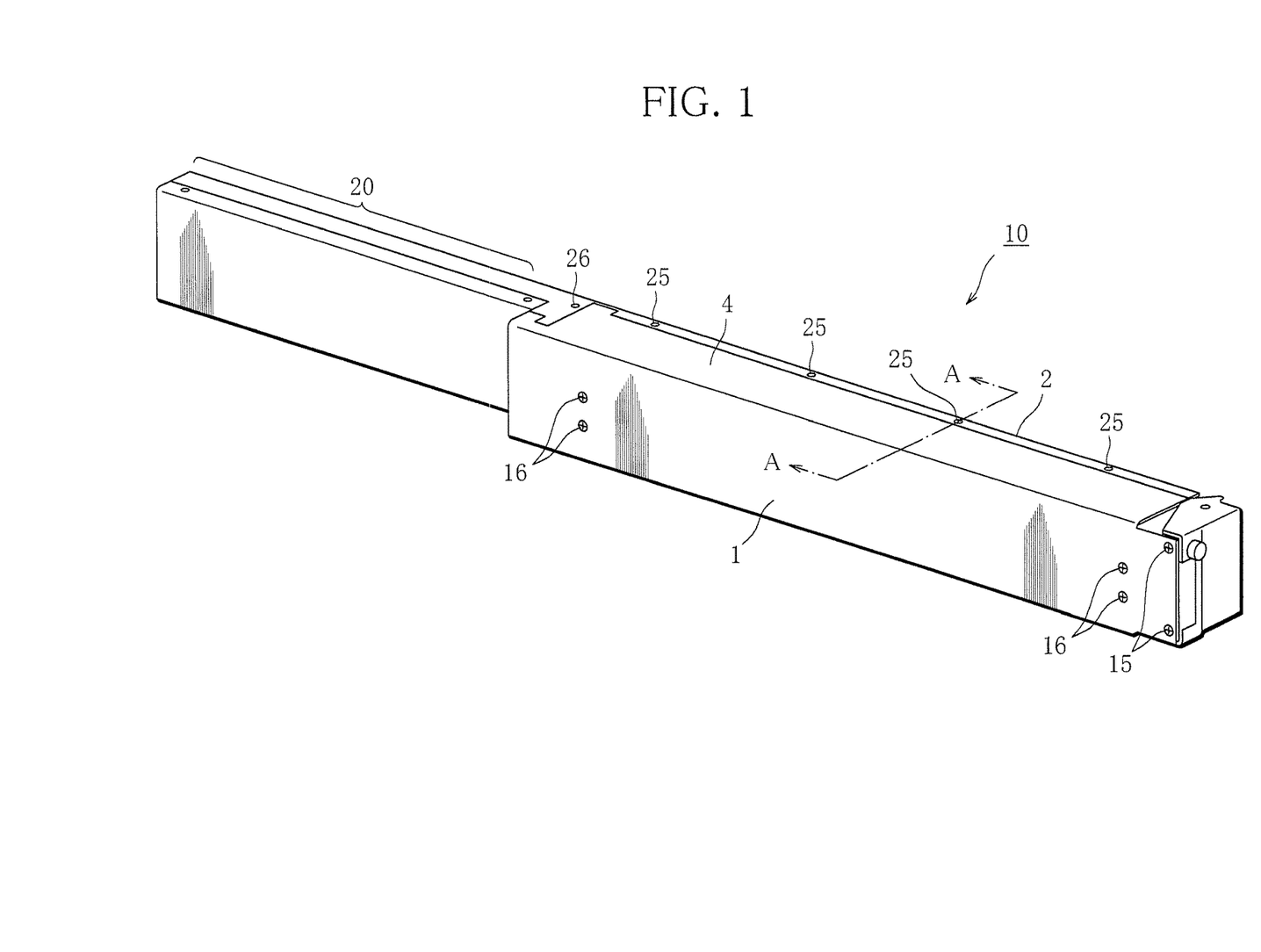
FIG. 1 is a perspective view showing an appearance of a battery unit according to the invention.

The housing cover 1 is fitted to a predetermined position of the housing body 2. To be more precise, the housing cover 1 is fitted to the housing body 2 with a longitudinal end 18 of the housing cover 1 in contact with a stepped portion 28 of the housing body 2, and with a longitudinal end 27 of the housing body 2 in contact with a stepped portion 17 of the housing cover 1 (FIGS. 1 and 5).

The circuit substrate 4 is screwed to the housing body 2 with four male screws 25. The male screws 25 are inserted into four circular through-holes 11 of the housing cover 1 and four circular through-holes 21 of the housing body 2. The male screws 25 are screwed into the female screw holes formed in the metal screw bushings 55 of the second substrate-supporting portions 53 of the substrate holders 5, thereby fastening the housing cover 1 and the housing body 2 together. The circuit substrate 4 is thus fixed to the housing body 2 with the four substrate holders 5 intervening therebetween (FIG. 5).

The metal screw bushings 54 provided to the first substrate-supporting portions 52 of the substrate holders 5 are not used in the present embodiment. It is also possible to provide four through-holes to the housing cover 1 to be located at positions corresponding to the female screw holes of the metal screw bushings 54, and screw the male screws into the female screw holes of the metal screw bushings 54 through the through-holes. By so doing, the four substrate holders 5 are screwed to the housing body 2 at both the ends, allowing the circuit substrate 4 to be more stably fitted to the housing body 2.

The housing cover 1 is then screwed to the housing body 2 by using two male screws 15, four male screws 16 and one male screw 26. In particular, the male screw 26 is inserted into the circular through-hole 22 of the housing body 2 and is then screwed into the female screw hole 12 of the housing cover 1. The male screws 15 are inserted into the two circular through-holes 13 of the housing cover 1 and are then screwed into the female screw holes 23 of the housing body 2. The male screws 16 are inserted into the four circular through-holes 14 of the housing cover 1 and are then screwed into the female screw holes 24 of the housing body 2.

In the battery unit 10 of the invention described above, the substrate holders 5 are arranged at intervals in the longitudinal direction X of the circuit substrate 4, and the circuit substrate 4 is supported by the substrate holders 5 at the longitudinal ends thereof. This more drastically reduces bending stress that is applied from the substrate holders 5 to the circuit substrate 4 than in conventional art. According to the invention, therefore, the possibility of deformation and fracture of the circuit substrate 4 and the like can be reduced.

Since the battery unit 10 of the invention is so configured that the circuit substrate 4 is supported by the substrate holders 5 arranged at intervals in the longitudinal direction X of the circuit substrate 4, it is possible to drastically reduce an area in which the components mounted on the circuit substrate 4 and the substrate holders 5 interfere with each other. In short, components can be mounted on both sides of the circuit substrate 4 to be located between each two adjacent substrate holders 5 arranged at intervals. According to the invention, therefore, freedom for component layout on the circuit substrate 4 and that for the design of circuit patterns are vastly improved.

Preferably, the battery unit 10 of the invention is so configured that, as in the embodiment, the circuit substrate 4 is supported while a plurality of notches (notches 41*a* to 41*h*) formed in the circuit substrate 4 are engaged with the substrate holders 5. Although this is not an essential constituent factor for the invention, the above configuration allows the circuit substrate 4 to be more firmly supported as positioned. The circuit substrate 4 is locked by the four substrate holders 5 held in engagement with the notches 41*a* to 41*h* of the circuit substrate 4, reducing the possibility of displacement of the circuit substrate 4, which is attributable to vibration or the like.

Preferably, each of the substrate holders 5 of the battery unit 10 of the invention includes, as in the embodiment, the elastically deformable connecting plate 51 and two substrate-supporting portions (first and second substrate-supporting portions 52 and 53) that are formed in a standing manner in both ends of the connecting plate 51 and provided in the inner surfaces with grooves in which the longitudinal ends of the circuit substrate 4 can be interfitted. Although this is not an essential constituent factor for the invention, the above configuration makes it possible to easily attach/detach the circuit substrate 4 to/from the substrate holders 5 with a simple action as explained above.

Needless to say, the invention is not particularly limited to the foregoing embodiment, but may be modified in various ways within the scope of the invention defined in claims.

Although the embodiment uses the supporting structure of the charge-discharge protection circuit substrate in the battery unit, the "circuit-substrate supporting device" of the invention described above is not particularly limited to this. For example, the invention can be applied to the supporting structure of a main substrate in an electronic device provided with a microcomputer control circuit, the supporting structure of a sub-substrate mounted with an electronic switch and LED, etc. In short, the invention can be applied to any electronic device including a circuit substrate and can provide the operation and advantages thereof at the same time. As a battery unit, the embodiment uses the battery unit serving as an emergency power source of a server, but the battery unit is not limited to this. For example, the invention can be applied to any battery unit with a built-in circuit substrate and built-in batteries, including battery units for office automation equipment, such as desktop personal computers, printers, fax machines and copier complex machines, battery packs for mobile devices, such as notebook computers, laptop personal computers, and digital cameras, and can provide the operation and advantages thereof at the same time.

What is claimed is:

1. A circuit-substrate supporting device comprising:
a circuit substrate including a first end and a second end each extending along the circuit substrate, wherein the first end and the second end are included in the outer periphery of the circuit substrate, and the second end is arranged on the opposite side of the first end;
a plurality of supporting members arranged spaced apart from each other at intervals along the circuit substrate;
each of the supporting members including a first substrate supporting portion and a second substrate supporting portion that are connected by an elastically deformable base portion extending across the circuit substrate from the first end of the circuit substrate to the second end of the circuit substrate; and
a housing onto which the supporting members are fixed, wherein the first substrate supporting portion engages the first end of the circuit substrate and the second substrate supporting portion engages the second end of the circuit substrate, wherein the first substrate-supporting portion and the second substrate-supporting portion are formed in a standing manner at opposite ends of the base portion, the first substrate-supporting portion including a first inner face having a first groove into which the first end of the circuit substrate can be fitted, the second substrate-supporting portion including a second inner face having a second groove into which the second end of the circuit substrate can be fitted.

2. The circuit-substrate supporting device according to claim 1, wherein the circuit substrate includes a plurality of notches formed in the first and second ends at intervals along the circuit substrate; and
the supporting members are arranged in positions corresponding to the notches of the circuit substrate and support both the first and second ends of the circuit substrate while being in engagement with the notches.

3. A battery unit comprising:
a circuit substrate including a first end and a second end each extending along the circuit substrate, wherein the first end and the second end are included in the outer periphery of the circuit substrate, and the second end is arranged on the opposite side from the first end;
a plurality of supporting members arranged spaced apart from each other at intervals along the circuit substrate;
each of the supporting members having a first substrate supporting portion and a second substrate supporting portion connected by an elastically deformable base portion extending across the circuit substrate from the first end of the circuit substrate to the second end of the circuit substrate, the first substrate supporting portion, the second substrate supporting portion, and the elastically deformable base portion having a U-shaped cross-section, wherein the first substrate-supporting portion and the second substrate-supporting portion are formed in a standing manner at opposite ends of the base portion, the first substrate-supporting portion including a first inner face having a first groove into which the first end of the circuit substrate can be fitted, the second substrate-supporting portion including a second inner face having a second groove into which the second end of the circuit substrate can be fitted;
a housing onto which the supporting members are fixed; and
batteries supported in the housing and arranged adjacent to the circuit substrate.

4. A circuit-substrate supporting device comprising:
a circuit substrate including a first end and a second end opposite the first end, wherein each of the first and second ends are parallel to a longitudinal axis of the circuit substrate, and the first end and the second end are included in the outer periphery of the circuit substrate;

a plurality of supporting members arranged adjacent one another along the circuit substrate, the supporting members being spaced apart from each other along the longitudinal axis;

each of the supporting members being U-shaped and having an elastically deformable base portion extending across the circuit substrate so that opposite ends of the supporting member grip the opposite first and second ends of the circuit substrate each of the supporting members including a first upturned end and a second upturned end, the first upturned end gripping the first end of the circuit substrate, the second upturned end gripping the second end of the circuit substrate, wherein the first upturned end of at least one of the supporting members including a first groove dimensioned to receive the first end of the circuit substrate; and the second upturned end of the at least one of the supporting members including a second groove dimensioned to receive the second end of the circuit substrate; and a housing fixable to each of the plurality of supporting members.

5. The circuit-substrate supporting device of claim 4, the first end of the circuit substrate including a plurality of notches arranged adjacent one another and spaced apart along the longitudinal axis of the circuit substrate;

the second end of the circuit substrate including a plurality of notches arranged adjacent one another along the longitudinal axis of the circuit substrate;

the first upturned end of at least one of the supporting members gripping one of the notches formed in first end of the circuit substrate; and the second upturned end of the at least one of the supporting members gripping one of the notches formed in the second end of the circuit substrate.

6. The circuit-substrate supporting device according to claim 1, each of the supporting members having a U-shaped cross section.

7. The battery unit according to claim 3, wherein the base is positioned between the circuit substrate and the batteries.

* * * * *